US010613443B2

(12) United States Patent
Hartjes

(10) Patent No.: US 10,613,443 B2
(45) Date of Patent: Apr. 7, 2020

(54) OPTICAL SYSTEM, LITHOGRAPHY APPARATUS AND METHOD

(71) Applicant: Carl Zeiss SMT GmbH, Oberkochen (DE)

(72) Inventor: Joachim Hartjes, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 16/277,102

(22) Filed: Feb. 15, 2019

(65) Prior Publication Data
US 2019/0196339 A1 Jun. 27, 2019

Related U.S. Application Data

(63) Continuation of application No. PCT/EP2017/070722, filed on Aug. 16, 2017.

(30) Foreign Application Priority Data

Aug. 18, 2016 (DE) .................. 10 2016 215 540

(51) Int. Cl.
G03B 27/42 (2006.01)
G03F 7/20 (2006.01)
(Continued)

(52) U.S. Cl.
CPC .......... G03F 7/7015 (2013.01); G02B 7/026 (2013.01); G02B 7/1805 (2013.01); G03F 7/7095 (2013.01); G03F 7/70825 (2013.01)

(58) Field of Classification Search
CPC .......... G02B 7/02; G02B 7/021; G02B 7/023; G02B 7/022; G02B 7/10; G02B 3/00; G02B 7/003; G02B 7/08; G02B 7/026; G02B 7/028; G02B 13/002; G02B 13/003; G02B 13/0045; G02B 27/646; G02B 27/017
See application file for complete search history.

(56) References Cited

U.S. PATENT DOCUMENTS 6,392,825 B1* 5/2002 Trunz ............... G02B 7/026
359/811
2002/0163741 A1 11/2002 Shibazaki
(Continued)

FOREIGN PATENT DOCUMENTS

DE 199 04 152 A1 8/2000
JP 2000-227533 A 8/2000
WO WO 2009/083476 7/2009

OTHER PUBLICATIONS

International Search Report and Written Opinion for corresponding PCT Appl No. PCT/EP2017/070722, dated Nov. 23, 2017.
(Continued)

Primary Examiner — Mesfin T Asfaw
(74) Attorney, Agent, or Firm — Fish & Richardson P.C.

(57) ABSTRACT

An optical system for a lithography apparatus, having a first component, a second component, and an optical element, which is held between the first component and the second component with force-fit engagement and for this purpose is subjected to a clamping force. At least one of the components includes a bearing portion which contacts the optical element and which has a shape-memory alloy.

20 Claims, 7 Drawing Sheets

(51) Int. Cl.
G02B 7/02 (2006.01)
G02B 7/18 (2006.01)

(56) References Cited

U.S. PATENT DOCUMENTS

2004/0150806 A1* 8/2004 Brunotte .................. G02B 1/02
  355/67
2008/0043349 A1 2/2008 Rief et al.

OTHER PUBLICATIONS

Japanese Office Action, with English summary, for corresponding JP Appl No. 2019-508201, dated Feb. 4, 2020.

* cited by examiner

OPTICAL SYSTEM, LITHOGRAPHY APPARATUS AND METHOD

CROSS-REFERENCE TO RELATED APPLICATIONS

The present application is a continuation of, and claims benefit under 35 USC 120 to, international application PCT/EP2017/070722, filed Aug. 16, 2017, which claims benefit under 35 USC 119 of German patent application DE 10 2016 215 540.7, filed on Aug. 18, 2016. The entire disclosure of these applications are incorporated by reference herein.

FIELD

The present disclosure relates to an optical system for a lithography apparatus, to a lithography apparatus with such an optical system, and to a method for producing such an optical system.

BACKGROUND

Microlithography is used for producing microstructured components, for example integrated circuits. The microlithography process is carried out with a lithography apparatus including an illumination system and a projection system. The image of a mask (reticle) illuminated via the illumination system is in this case projected via the projection system onto a substrate (for example a silicon wafer) which is coated with a light-sensitive layer (photoresist) and arranged in the image plane of the projection system, in order to transfer the mask structure to the light-sensitive coating of the substrate.

The projection system can have a multiplicity of refracting and/or reflecting optical elements, for example lenses or mirrors. Each optical element can be received or held in a holding device, in particular in a mount. A force-fit or frictional and/or form-fit connection can in this case be provided between the optical element and the holding device. In the operation of the lithography apparatus, the optical elements can be moved and accelerated. A relative movement between the optical element and the holding device assigned to the latter is undesirable.

In order to secure the position of the optical element with respect to the holding device, a defined clamping force is used with which the optical element is clamped between two components of the holding device. During the acceleration of the optical element, a frictional force resulting from the clamping force acts counter to acceleration forces acting on the optical element. In order to prevent a movement of the optical element with respect to the holding device, it is therefore desirable that the frictional force is always greater or at least equal to the acceleration forces. The clamping force therefore always has to be maintained at a sufficient level.

To adjust the optical element, it is also desirable that a contact face between the optical element and the holding device is as small as possible, preferably involving a punctiform or linear contact. However, a punctiform or linear contact is unfavourable in terms of the extent of the so-called surface pressure between two connection partners. If the admissible surface pressure is exceeded, this can lead to undesired stress-induced changes of the optical properties of the optical element.

SUMMARY

In order to adjust the optical element, it is desirable to have as small as possible a contact face between the optical element and the holding device and, in order to reduce the surface pressure, it is desirable for the contact face to be as large as possible.

The present disclosure seeks to make available an improved optical system.

Accordingly, an optical system for a lithography apparatus is proposed. The optical system has a first component, a second component, and an optical element which is held between the first component and the second component with force-fit engagement and for this purpose is subjected to a clamping force, wherein at least one of the components includes a bearing portion which contacts the optical element and which has a shape-memory alloy.

In particular, in the pseudo-elastic deformation of the bearing portion, a contact face between the optical element and at least one of the components increases, and a radius of a rounding provided on the bearing portion increases. This surface enlargement leads to a reduction of the surface pressure between the optical element and the bearing portion. The enlargement of the radius leads to a reduction of the Hertzian stress. This prevents influencing of the properties, in particular the optical properties, of the optical element. Moreover, the surface enlargement also improves the heat transfer between the optical element and the bearing portion. Therefore, by comparison with known optical systems, it is possible to achieve stress-reduced and improved clamping at a constant clamping force, an improved heat transfer since the contact face becomes larger, and a reduced surface pressure.

In particular, the shape-memory alloy is pseudo-elastically deformable. The bearing portion is preferably pseudo-elastically deformed by a clamping distance. A holding device of the optical system can include the first component and the second component. The holding device can also be designated as a mount. The bearing portion can be produced partially or completely from the shape-memory alloy. The bearing portion can be formed in one piece with one of the components, in particular by material bonding. That is to say, the bearing portion and the corresponding component are cohesively connected to each other and form a one-piece component. In cohesive connections, the connection partners are held together by atomic or molecular forces. Cohesive connections are non-releasable connections that can be separated only by destruction of the connection arrangement. Alternatively, the bearing portion and the corresponding component can be two mutually separate components which are rigidly connected to each other. The components can be connected to each other with the aid of connection elements, in particular screws. With the aid of the connection elements, the optical element arranged between the components can be subjected to the clamping force. Each of the components can include a bearing portion.

A shape-memory alloy is a metallic material that is transformable between a martensitic structure and an austenitic structure. The shape-memory alloy can have a high-temperature phase called austenite and a low-temperature phase called martensite. For initiation of a phase transformation, the parameters of temperature and mechanical stress are of equal value. That is to say, the transformation can be brought about not just thermally but also by a mechanical stress resulting from the clamping force.

In shape-memory alloys, in addition to the usual elastic deformation, it is possible to observe a reversible change of shape caused by the action of an external force. The reason for this behaviour is not the binding force of the atoms, but a phase transition within the material. The shape-memory alloy is present for this purpose in the high-temperature phase with an austenitic structure. Under external stresses, the face-centred cubic austenite transforms into the tetragonally distorted martensite. Upon unloading, the martensite transforms back to austenite. Since each atom retains its neighbouring atom during the transition, this is also referred to as diffusionless phase transition. The property is therefore designated as pseudo-elastic behaviour. Upon unloading, the material returns to its original shape through its internal stress. No temperature changes are needed for this.

Pseudo-elasticity or super-elasticity is therefore to be understood as a reversible change of shape of the shape-memory alloy caused by the action of an external force and based on a diffusionless phase transition from austenite to martensite. This phase transition is reversible. That is to say, as soon as the force is no longer acting, the martensite changes back to austenite.

The shape-memory alloy can have nickel-titanium (NiTi) or copper-zinc-aluminium (CuZnAl). Advantageously, NiTi and CuZnAl are suitable shape-memory alloys. Moreover, the hysteresis behaviour can be reduced by using titanium-nickel-copper (TiNiCu) and/or a titanium-nickel-palladium (TiNiPd) alloy among others.

The pseudo-elasticity of the shape-memory alloy is temperature-dependent in particular. The working points when the pseudo-elasticity can be utilized are dependent on the material treatment and on the alloy composition. For example, a working point can be at 22° C. and can ensure clamping in a process temperature range from 20° C. to 100° C.

According to one embodiment, the bearing portion contacts the optical element in a punctiform or linear manner in a pseudo-elastically undeformed state.

On account of the punctiform or linear contact, the optical element can be adjusted. During the adjustment, the optical element can be oriented relative to the first component and/or to the second component.

According to a further embodiment, the bearing portion in the pseudo-elastically undeformed state contacts the optical element in a punctiform or linear manner with more than one point contact and with more than one line contact, respectively.

For example, the bearing portion contacts the optical element with a two-point contact. After the pseudo-elastic deformation of the bearing portion, the latter no longer contacts the optical element at several points but instead with a large contact face.

According to a further embodiment, a contact face between the bearing portion and the optical element in the pseudo-elastically undeformed state of the bearing portion is smaller than a contact face between the bearing portion and the optical element in a pseudo-elastically deformed state of the bearing portion.

In the pseudo-elastic deformation of the bearing portion, a volume of the latter does not change. Only a geometry of the bearing portion changes.

According to a further embodiment, the first component and/or the second component in each case include a multiplicity of bearing portions.

For example, the first component and/or the second component can each include two or more bearing portions. The bearing portions can be oriented in any desired way relative to each other.

According to a further embodiment, the optical element is received with form-fit engagement in the first component and/or in the second component.

A form-fit connection is obtained by at least two connection partners engaging one inside the other or one behind the other. In particular, the first component includes a receiving portion in which the optical element is received. The receiving portion can have a cylindrical inner contour, which corresponds to a cylindrical outer contour of the optical element.

According to a further embodiment, the first component and the second component are ring-shaped, wherein the second component is connected with form-fit and/or force-fit engagement to the first component.

A force-fit connection assumes a normal force, in this case the clamping force, on the surfaces that are to be connected to each other. Force-fit connections can be obtained by frictional engagement. A force-fit connection can therefore also be designated as a frictional connection. The first component can be designated as a mount and the second component can be designated as a clamping ring.

According to a further embodiment, the bearing portion is ring-shaped.

The bearing portion can have a circumferentially closed contour. Alternatively, the contour can also be interrupted and, for example, include a multiplicity of punctiform contact sites arranged in a ring shape.

According to a further embodiment, the first component and the second component are plate-shaped, wherein the second component is connected with form-fit and/or force-fit engagement to the first component.

The first component can have a plate-shaped base portion, with two ridge-shaped bearing portions extending out from a front face thereof directed towards the optical element. The bearing portions are preferably arranged parallel to each other and spaced apart from each other. A respective height of the bearing portions from the front face may vary. That is to say, the bearing portions can be slightly inclined relative to the front face. The height difference can be a few µm. The bearing portions are preferably inclined in opposite directions.

According to a further embodiment, the bearing portion is web-shaped.

"Web-shaped" is preferably to be understood here as a rib-shaped geometry. The bearing portion is preferably straight, that is to say not curved.

According to a further embodiment, the optical element is a prismatic body, a mirror or a lens.

The optical element can refract or reflect electromagnetic radiation, in particular light. The optical element can have, for example, quartz glass, optical glass or calcium fluoride or can be produced from optical glasses, quartz glass or calcium fluoride. The optical element can, for example, include two optically effective surfaces arranged opposite each other. The optically effective surfaces can be surface-modified, in particular coated. The optically effective surfaces can be plane or curved, in particular spherically curved.

A lithography apparatus with such an optical system is moreover proposed.

The lithography apparatus can include several optical systems. The lithography apparatus can be an EUV lithography apparatus or a DUV lithography apparatus. EUV stands for "extreme ultraviolet" and refers to a wavelength of the working light of between 0.1 and 30 nm. DUV stands for "deep ultraviolet" and refers to a wavelength of the working light of between 30 and 250 nm.

A method is moreover proposed for producing an optical system for a lithography apparatus. The method includes the steps of: a) arranging an optical element between a first component and a second component, wherein at least one of the components includes a bearing portion which contacts the optical element and which has a shape-memory alloy, b) subjecting the first component and/or the second component to a clamping force in order to hold the optical element with force-fit engagement between the first component and the second component, and c) pseudo-elastically deforming the bearing portion.

The method can also include a step of adjusting the optical element, which step is carried out before step b). Steps b) and c) preferably take place simultaneously. In particular, the bearing portion is pseudo-elastically deformed by the clamping distance. The clamping force can be applied via the first component being connected to the second component, in particular by screwing. In step a), the optical element can be placed into a receiving portion of the first component. The shape-memory alloy is pseudo-elastically deformed in step c), wherein the austenite transforms to martensite. This transformation does not have to be complete. A partial transformation of the stress-induced martensite may be sufficient to utilize the pseudo-elastic effect. The transformation is reversible. The transformation is in particular a stress-induced martensite formation. Since the austenitic state corresponds in terms of energy to the high-temperature state, the material returns to this state when unloaded.

According to one embodiment, the first component and/or the second component are subjected to an adjusting force before step c), wherein the bearing portion is elastically deformed with the aid of the adjusting force.

The adjusting force is less than or equal to the clamping force. In the elastic deformation of the bearing portion, the adjusting force increases until the level of the pseudo-elastic deformation is reached. Thereafter, the force increases only very slightly during the pseudo-elastic deformation along the expansion. Expansions of up to a maximum of 8% can be reached while the clamping force is reached and the bearing portion is pseudo-elastically deformed.

According to a further embodiment, in the pseudo-elastic deformation of the bearing portion, a contact face between the bearing portion and the optical element is enlarged.

In step c), a radius of a rounding of the bearing portion contacting the optical element can also be enlarged. In this way, the Hertzian stress is reduced. The enlarged contact face leads to an improved heat transfer between the optical element and at least one of the components. Through the interaction of electromagnetic radiation with the optical element, heat can be introduced into the latter which is to be removed from the optical element in order to prevent heat-induced changes of the optical properties of the optical element. The enlarged contact face also leads to a reduction of the surface pressure.

Further possible implementations of the disclosure also include not explicitly mentioned combinations of features or embodiments that are described above or below with respect to the exemplary embodiments. In this respect, a person skilled in the art will also add individual aspects to the respective basic form of the disclosure as improvements or additions.

Further advantageous configurations and aspects of the disclosure are the subject of the dependent claims and also of the exemplary embodiments of the disclosure described below.

BRIEF DESCRIPTION OF THE DRAWINGS

In the text that follows, the disclosure is explained in more detail on the basis of preferred embodiments with reference to the accompanying figures, in which.

EXEMPLARY EMBODIMENTS OF THE DISCLOSURE

Identical elements or elements having an identical function have been provided with the same reference signs in the figures, unless indicated to the contrary. In so far as a reference sign has a plurality of reference lines in the present case, this means that the corresponding element is present multiply. Reference sign lines pointing to concealed details are illustrated in a dashed manner. It should also be noted that the illustrations in the figures are not necessarily to scale.

Figure 1A:
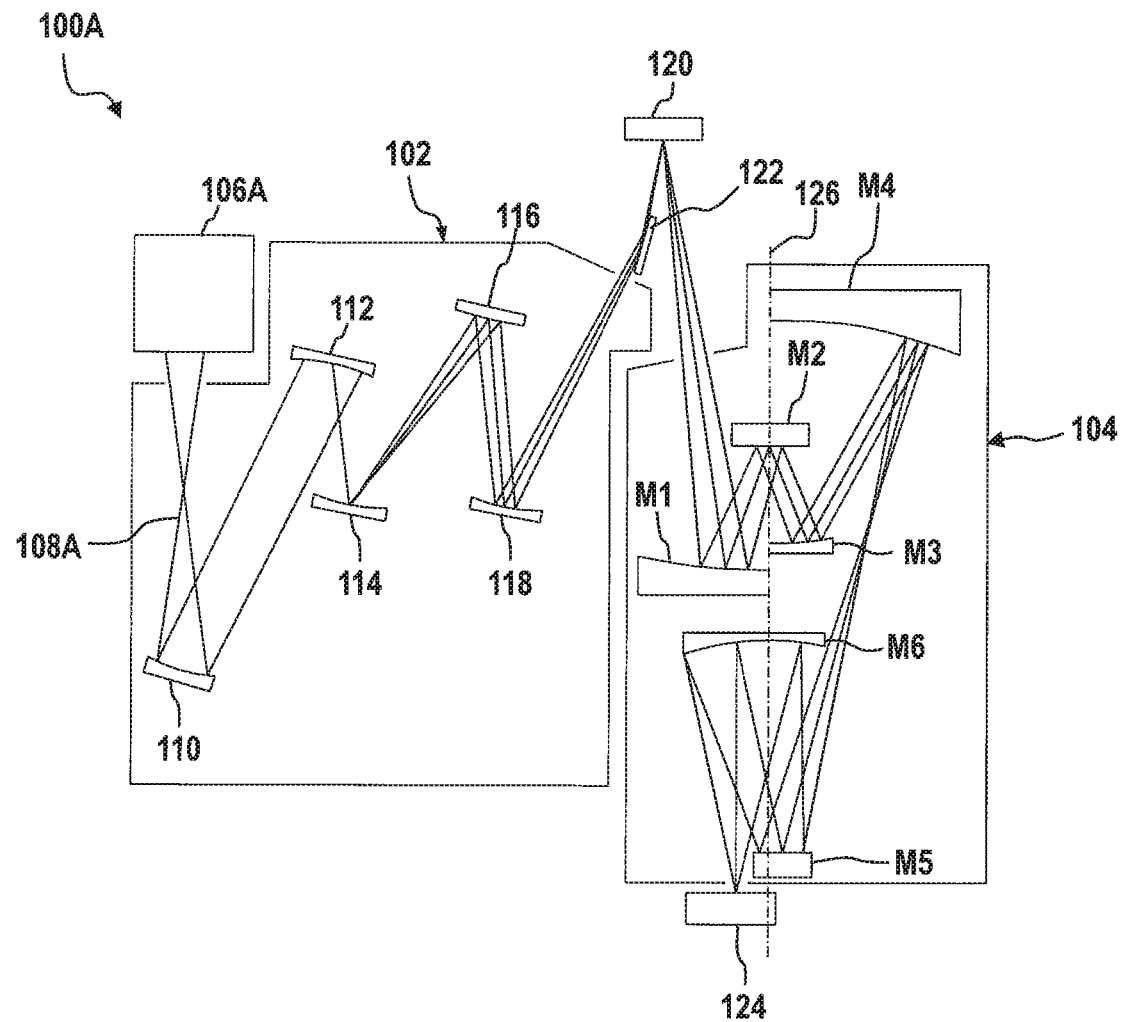
FIG. 1A shows a schematic view of an embodiment of an EUV lithography apparatus.

FIG. 1A shows a schematic view of an EUV lithography apparatus 100A, which includes a beam-shaping and illumination system 102 and a projection system 104. EUV stands for "extreme ultraviolet" and refers to a wavelength of the working light of between 0.1 and 30 nm. The beam-shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which the drive appliances for mechanically moving or adjusting the optical elements are provided. Moreover, electrical controllers and the like can also be provided in this machine room.

The EUV lithography apparatus 100A includes an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam-shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam-guiding spaces in the beam-shaping and illumination system 102 and in the projection system 104 are evacuated.

The beam-shaping and illumination system 102 illustrated in FIG. 1A has five mirrors 110, 112, 114, 116, 118. After passing through the beam-shaping and illumination system 102, the EUV radiation 108A is guided onto a photomask (called a reticle) 120. The photomask 120 is likewise formed as a reflective optical element and can be arranged outside the systems 102, 104. Furthermore, the EUV radiation 108A can be directed onto the photomask 120 via a mirror 122. The photomask 120 has a structure which is imaged onto a wafer 124 or the like in a reduced fashion via the projection system 104.

The projection system 104 (also referred to as projection objective) has six mirrors M1 to M6 for imaging the photomask 120 onto the wafer 124. In this case, individual mirrors M1 to M6 of the projection system 104 can be arranged symmetrically in relation to an optical axis 126 of the projection system 104. It should be noted that the number of mirrors of the EUV lithography apparatus 100A is not restricted to the number represented. A greater or lesser number of mirrors can also be provided. Furthermore, the mirrors are generally curved on their front face for beam shaping.

Figure 1B:
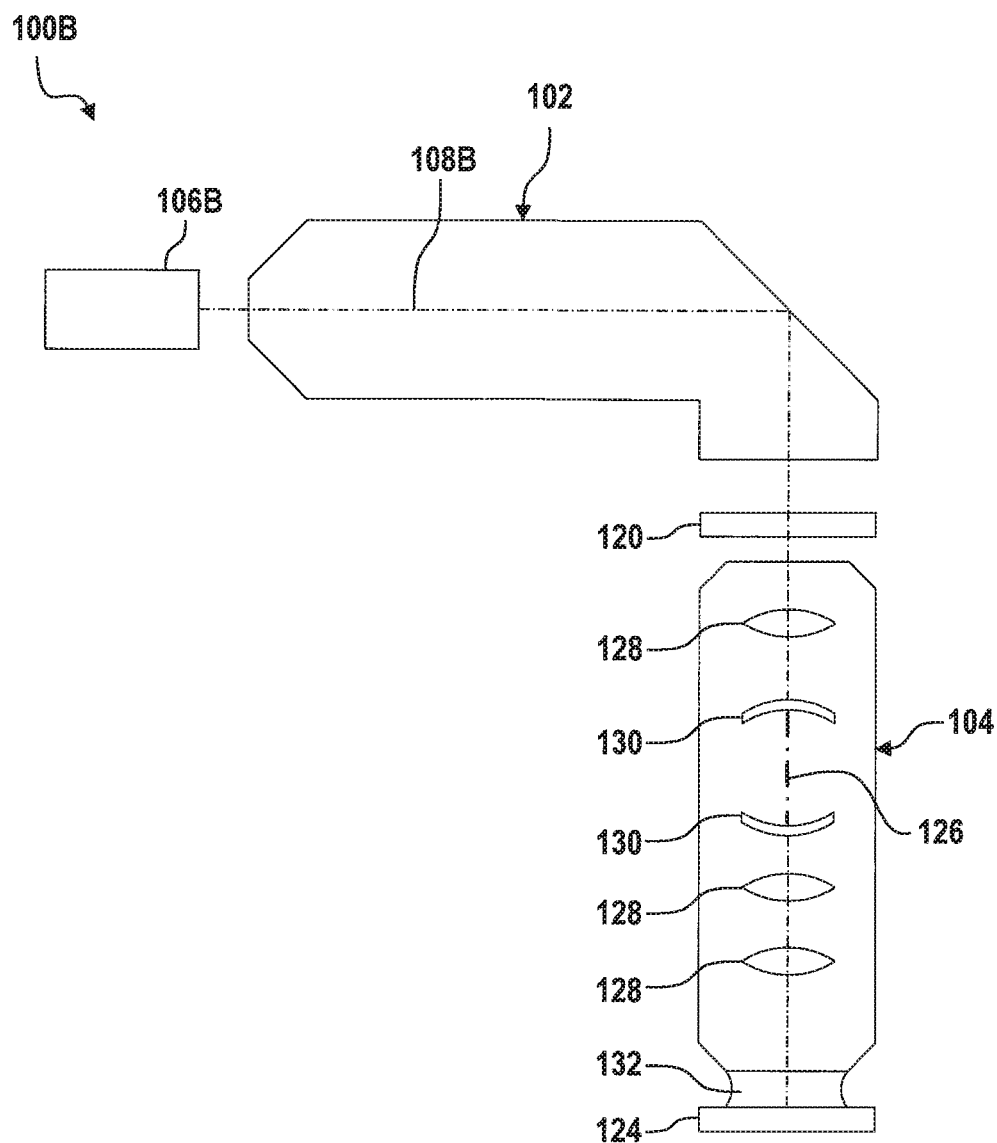
FIG. 1B shows a schematic view of an embodiment of a DUV lithography apparatus.

FIG. 1B shows a schematic view of a DUV lithography apparatus 100B, which includes a beam-shaping and illumination system 102 and a projection system 104. DUV stands for "deep ultraviolet" and refers to a wavelength of the working light of between 30 and 250 nm. As has already been described with reference to FIG. 1A, the beam-shaping and illumination system 102 and the projection system 104 can be arranged in a vacuum housing and/or surrounded by a machine room with corresponding drive appliances.

The DUV lithography apparatus 100B has a DUV light source 106B. By way of example, an ArF excimer laser that emits radiation 108B in the DUV range at 193 nm, for example, can be provided as the DUV light source 106B.

The beam-shaping and illumination system 102 illustrated in FIG. 1B guides the DUV radiation 108B onto a photomask 120. The photomask 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lenses 128 and/or mirrors 130 for imaging the photomask 120 onto the wafer 124. In this case, individual lenses 128 and/or mirrors 130 of the projection system 104 can be arranged symmetrically in relation to an optical axis 126 of the projection system 104. It should be noted that the number of lenses and mirrors of the DUV lithography apparatus 100B is not restricted to the number represented. A greater or lesser number of lenses and/or mirrors can also be provided. Furthermore, the mirrors are generally curved on their front face for beam shaping.

An air gap between the last lens 128 and the wafer 124 can be replaced by a liquid medium 132 which has a refractive index of >1. The liquid medium can be high-purity water, for example. Such a construction is also referred to as immersion lithography and has an increased photolithographic resolution.

Figure 2:
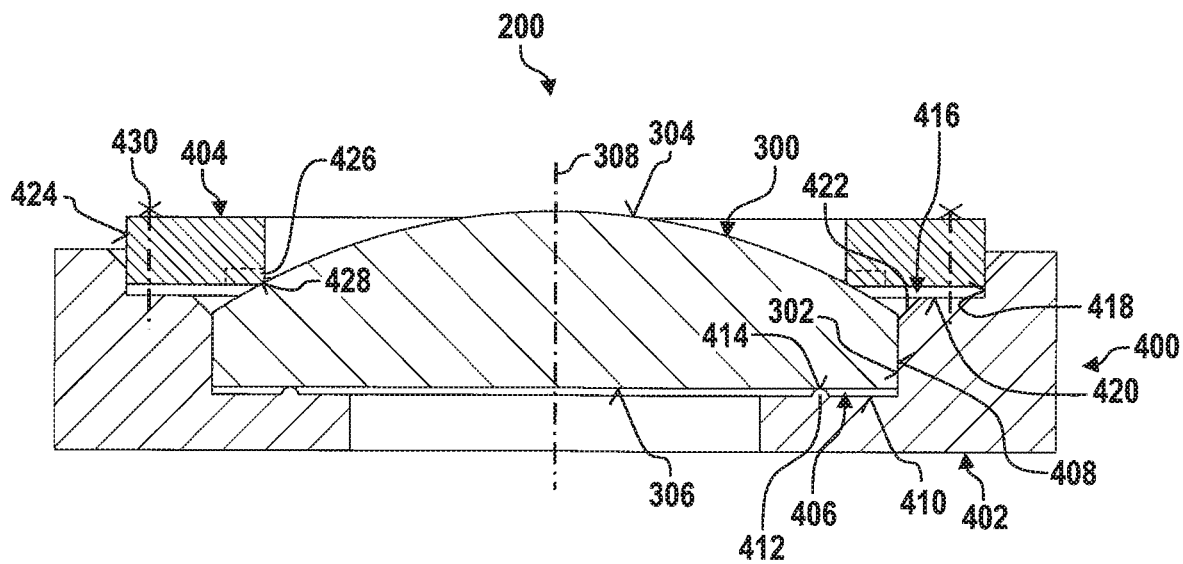
FIG. 2 shows a schematic sectional view of an embodiment of an optical system.

FIG. 2 shows a schematic sectional view of an optical system 200. The optical system 200 can be part of a lithography apparatus 100A, 100B. For example, the optical system 200 can be part of the beam-shaping and illumination system 102 or of the projection system 104. The optical system 200 includes an optical element 300. The optical element 300 can be a refracting, in particular light-refracting optical unit, for example one of the lenses 130, or a reflecting, in particular light-reflecting optical unit, for example one of the mirrors 110, 112, 114, 116, 118, 122, 130 or M1 to M6.

The optical element 300 shown in FIG. 2 is a lens. The optical element 300 can have a substantially cylindrical configuration with a circumferential cylindrical outer contour 302. The optical element 300 can moreover have optically effective surfaces 304, 306. For example, a first optically effective surface 304 can be convex, and a second optically effective surface 306 can be plane. It is also possible for both optically effective surfaces 304, 306 to be concave or convex or for one of the optically effective surfaces 304, 306 to be concave and the other optically effective surface 304, 306 convex or plane. One or both of the optically effective surfaces 304, 306 can be spherical, that is to say ball-shaped. The optical element 300 can have glass, in particular quartz glass, or any other desired material, for example calcium fluoride. The optical element 300 can be constructed to be rotationally symmetrical with respect to an axis of symmetry or central axis 308.

The optical system 200 further includes a holding device 400 for gripping or holding the optical element 300. The holding device 400 can also be referred to as a mount. The holding device 400 includes a first component 402 and a second component 404 between which the optical element 300 is clamped. The first component 402 can be a mount in which the optical element 300 is gripped. The mount can be designated by the reference sign 402. The second component 404 can be a clamping ring. The clamping ring can be designated by the reference sign 404.

The first component 402 can have a receiving portion 406 for receiving the optical element 300. The receiving portion 406 can have a cylindrical inner contour 408. The inner contour 408 corresponds to the outer contour 302 of the optical element 300. The optical element 300 can be received with its outer contour 302 in the inner contour 408, for example with a clearance fit. The receiving portion 406 furthermore includes a bottom surface 410, which does not touch the optical element 300.

A bearing portion 412, on which the optical element 300 bears, extends from the bottom surface 410 in the direction of the optical element. The bearing portion 412 can extend in a ring shape around the receiving portion 406. The bearing portion 412 can be formed in one piece with the first component 402, in particular by material bonding. Alternatively, the bearing portion 412 can also be designed as a separate structural element, which is rigidly connected to the first component 402. The bearing portion 412 has a rounding 414 directed towards the optical element 300. The rounding 414 can have a radius of one millimetre for example. The optical element 300 bears with the optically effective surface 306 linearly on the rounding 414.

The bearing portion 412 includes a shape-memory alloy or is produced from a shape-memory alloy. The entire first component 402 can be produced from a shape-memory alloy.

A shape-memory alloy is a metallic material that is transformable between a martensitic structure and an austenitic structure. The shape-memory alloy can have a high-temperature phase called austenite and a low-temperature phase called martensite. For initiation of a phase transition, the parameters of temperature and mechanical stress are of equal value. That is to say, the transition can be brought about not just thermally but also by a mechanical stress.

In the so-called two-way memory effect, both phases can merge one into the other by change of temperature for example. In the so-called one-way memory effect, a one-off change of shape is effected upon heating. However, the cooling alone does not cause any change of shape. The shape-memory alloy, which can be used for an actuator as adjusting element, can go back again to its "cold shape" via a resetting element being used, for example in the form of a spring.

In shape-memory alloys, in addition to the usual elastic deformation, it is possible to observe a reversible change of shape caused by the action of an external force. The reason for this behaviour is not the binding force of the atoms, but a phase transition within the material. The shape-memory alloy is present for this purpose in the high-temperature phase with an austenitic structure. Under external stresses, the face-centred cubic austenite transforms into the tetragonally distorted (body-centred cubic, tetragonally distorted lattice) martensite (stress-induced martensite). Upon unloading, the martensite transforms back to austenite. Since each atom retains its neighbouring atom during the transformation, this is also referred to as diffusionless phase transformation. The property is therefore designated as pseudo-elastic behaviour. Upon unloading, the material returns to its original shape through its internal stress. No temperature changes are needed for this.

The shape-memory alloy can have NiTi or CuZnAl. Advantageously, NiTi and CuZnAl are suitable shape-memory alloys. Moreover, the hysteresis behaviour can be reduced by using TiNiCu and/or a TiNiPd alloy among others.

The first component 402 further includes a receiving portion 416 for receiving the second component 404. The receiving portion 416 includes a cylindrical inner contour 418 and a plane bottom surface 420. The bottom surfaces 410, 420 can form two planes arranged parallel to each other. The inner contours 408, 418 can be positioned coaxially to each other. A bevel 422 is provided between the bottom surface 420 and the inner contour 408.

The second component 404 is received in the receiving portion 416. For this purpose, the second component 404 has a cylindrical outer contour 424, which is received in the inner contour 418 of the receiving portion 416. The outer contour 424 can, for example, be received in the inner contour 418 with a clearance fit.

The second component 404 includes a bearing portion 426 which bears linearly on the optical element 300, in particular on the optically effective surface 304. The bearing portion 426 can extend in a ring shape around the second component 404. The bearing portion 426 can be formed by a circumferential edge of the ring-shaped second component 404. The bearing portion 426 can be formed in one piece with the second component 404, in particular by material bonding. Alternatively, the bearing portion 426 can also be designed as a separate structural element, which is rigidly connected to the second component 404.

The bearing portion 426 has a rounding 428 directed towards the optical element 300. The rounding 428 can have a radius of one millimetre for example. The rounding 428 bears in a punctiform or linear manner on the optically effective surface 304 of the optical element 300. The bearing portion 426 can likewise have a shape-memory alloy or be produced from a shape-memory alloy. The entire second component 404 can be produced from a shape-memory alloy. Alternatively, the bearing portion 426 can also have another material, for example steel.

Moreover, the holding device 400 also includes at least one connection element 430, but preferably a multiplicity of connection elements 430 which connect the first component 402 to the second component 404. The connection element 430 is preferably a screw.

To grip the optical element 300 in the holding device 400, the optical element 300 is first of all inserted into the receiving portion 406 of the first component 402. The outer contour 302 of the optical element 300 can here be placed with a clearance fit into the inner contour 408 of the receiving portion 406.

Figure 3:
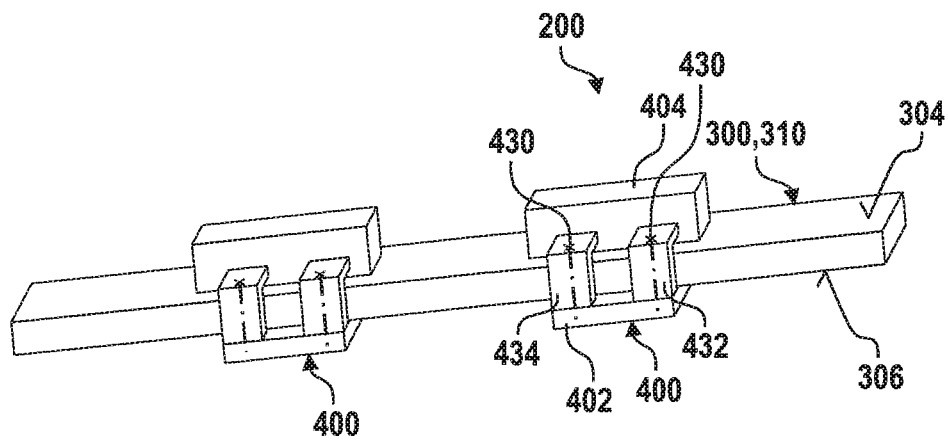
FIG. 3 shows a schematic perspective view of a further embodiment of an optical system.

FIG. 3 shows a schematic perspective view of a further embodiment of an optical system 200. In this embodiment of the optical system 200, the optical element 300 is not lens-shaped but rod-shaped. For example, the optical element 300 is a prismatic body 310, in particular a prismatic calcium fluoride body. The optical element 300 is received in two holding devices 400.

Figure 4:
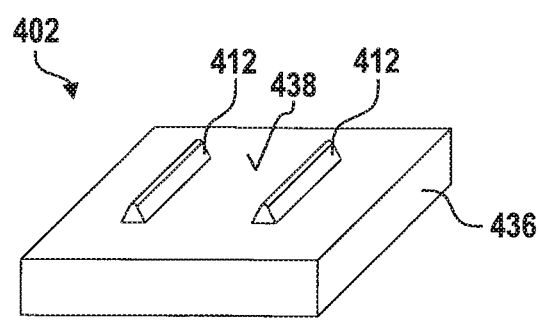
FIG. 4 shows a schematic perspective view of an embodiment of a component for the optical system according to FIG. 3.

The first component 402, which is shown in a schematic perspective view in FIG. 4, and the second component 404 are plate-shaped. The second component 404 includes grip portions 432, 434, which engage around the optical element 300. For example, four grip portions 432, 434 are provided. The second component 404 is connected to the first component 402 with the aid of several connection elements 430. The second component 404 can also have spring elements (not shown in FIG. 4) via which the optical element 300 is mechanically uncoupled from another component on which the second component 404 is secured.

As FIG. 4 shows, the first component 402 has a plate-shaped base portion 436, with two ridge-shaped bearing portions 412 extending out from a front face 438 directed towards the optical element 300. The bearing portions 412 are arranged parallel to each other and spaced apart from each other. A respective height of the bearing portions 412 from the front face 438 can vary. That is to say, the bearing portions 412 can be slightly inclined relative to the front face 438. The height difference can be a few μm. The bearing portions 412 are preferably inclined in opposite directions.

The functionality of the optical system 200 is explained below. To this end, reference is made to FIGS. 5 and 6, which show the optical system 200 in a highly abstract form. These figures detail only the contact between the optical element 300 and the first component 402, in particular the bearing portion 412 of the first component 402. The same details may apply analogously to the second component 404 and in particular to the bearing portion 426 of the second component 404.

Figure 5:
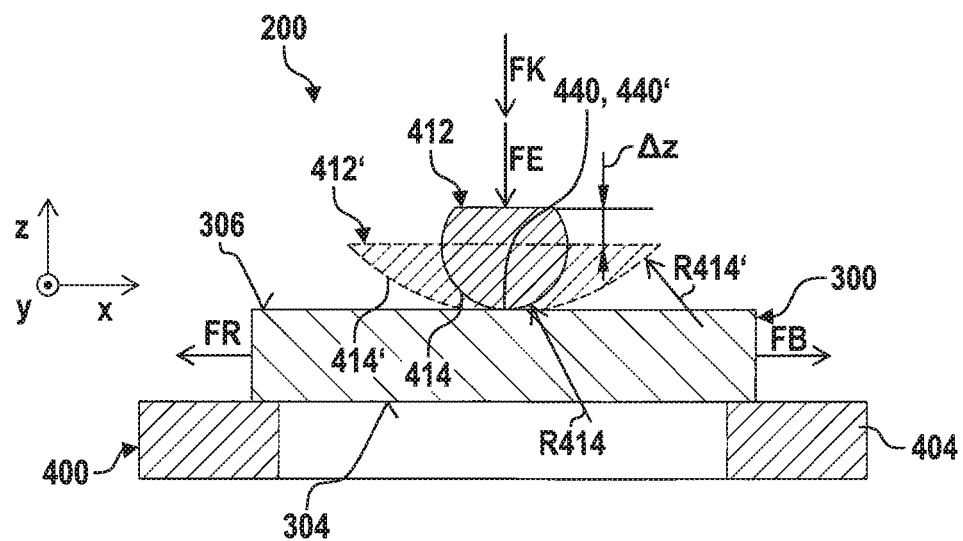
FIG. 5 shows a schematic sectional view of a further embodiment of an optical system.
Figure 6:
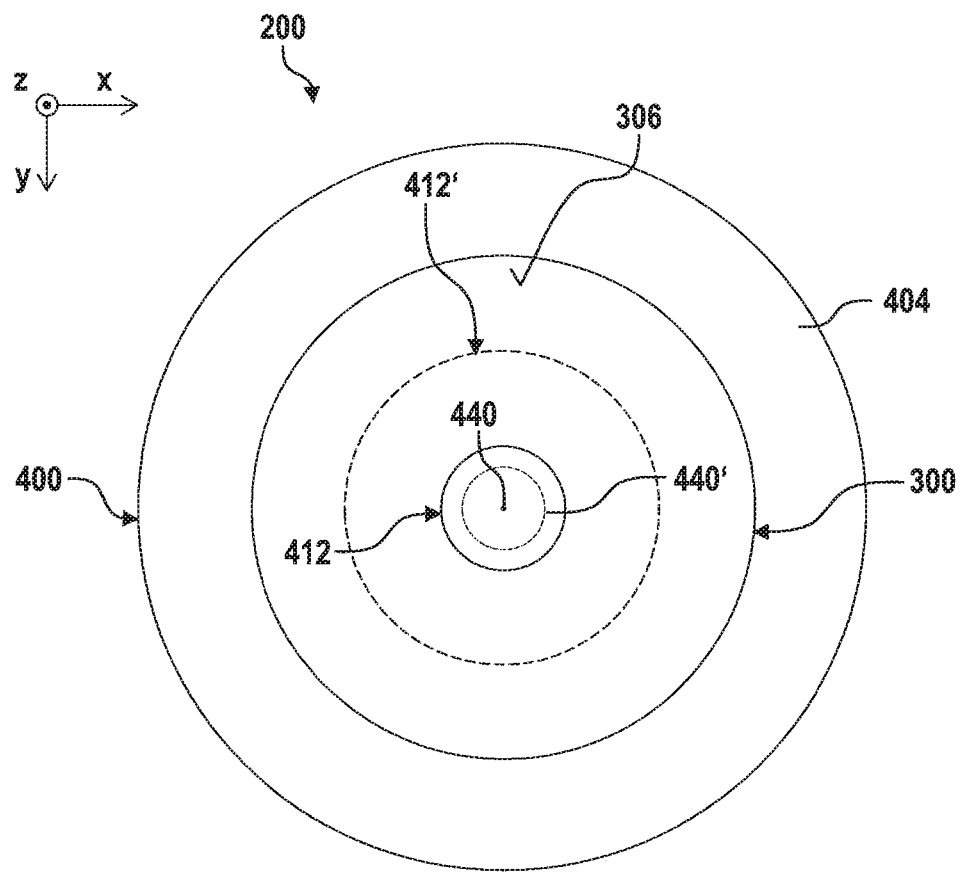
FIG. 6 shows a schematic plan view of the optical system according to FIG. 5.

FIGS. 5 and 6 show a coordinate system with an x direction, or first spatial direction x, a y direction, or second spatial direction y, which is orthogonal to the first spatial direction x, and a z direction, or third spatial direction z, which is oriented orthogonally with respect to the first spatial direction x and to the second spatial direction y.

The optical element 300 is held with form-fit or force-fit engagement in the holding device 400. In order to secure the position of the optical element 300, for example in the case of an acceleration of the optical system 200, with respect to the holding device 400, a defined clamping force FK is used with which the optical element 300 is clamped between the components 402, 404.

A frictional force FR between the optical element 300 and the bearing portion 412 derives in the simplest case from the product of the clamping force FK with the coefficient of friction. The coefficient of friction is a dimensionless measure for the frictional force in relation to the pressing force between two bodies. The level of the frictional force FR is thus dependent on the coefficient of friction.

During the acceleration of the optical system 200, the frictional force FR acts counter to acceleration forces FB acting on the optical element 300. As long as the frictional force FR is greater than or at least equal to the acceleration forces FB, the optical element 300 does not move with respect to the holding device 400. That is to say, in order to prevent a relative movement of the optical element 300 with respect to the holding device 400, it is desirable that the clamping force FK is always maintained.

To adjust the optical element 300, it is on the one hand desirable that a contact face between the optical element 300 and the components 402, 404 is as small as possible, preferably involving a punctiform or linear contact. A linear contact can be achieved with the aid of the rounding 414 provided on the bearing portion 412. On the other hand, a punctiform or linear contact is unfavourable in terms of the level of the admissible surface pressure between two connection partners, for example the optical element 300 and the first component 402 or the second component 404.

The surface pressure is understood as the force per contact face between two solids, for example the optical element 300 and the first component 402 or the second component 404. The level of the surface pressure is thus dependent on the size of the contact face. The larger the contact face, the lower the surface pressure. For linearly elastic materials, the surface pressure is usually calculated on the basis of the half-space theory; the Hertzian stress equations can be used for specific, simple bodies.

The Hertzian stress is understood as the greatest stress that prevails at the centre of the contact face of two elastic bodies. If two rigid bodies with a curved surface are pressed against each other, they are then only in linear or punctiform contact with each other in the idealized case. In reality, however, the elasticity at the contact site causes a flattening and a contact face, and also a characteristic stress distribution on the contact face in both bodies, namely the surface pressure.

The size and shape of the contact face and the level and distribution of the mechanical stresses under the contact face can be calculated according to Hertz. Thus, the level of the Hertzian stress depends on the force with which the two bodies are pressed onto each other, on their radii of curvature, and on their modulus of elasticity. The greater the radii of curvature, the lower the Hertzian stress.

However, in the force-fit engagement between the optical element 300 and the first component 402 and/or the second component 404, the admissible surface pressure limiting the material is desirably not be exceeded. For example, if the admissible surface pressure is exceeded, this can lead to a stress-induced retardation, that is to say to a change of the optical properties of the optical element 300, in particular the polarization or the phase of electromagnetic radiation, in particular light, interacting with the optical element 300, and such a change should be avoided in order to ensure the functionality of the optical system 200.

In order on the one hand to ensure the adjustability of the optical element 300 and on the other hand not to exceed the admissible surface pressure, the pseudo-elastic effect of the shape-memory alloy used for the bearing portion 412 is exploited. Moreover, it is also desirable to achieve a high degree of stiffness and good thermal conductivity, and this can be obtained by a suitably large contact face between the optical element 300 and the first component 402 or the second component 404. Good thermal conductivity is desireed to ensure that thermal energy introduced into the optical element 300 can be introduced from the latter into the holding device 400. In this way, heat-induced stresses and/or deformations of the optical element 300 are prevented.

As is shown in FIG. 5, an adjusting force FE is applied to the first component 402. The adjusting force FE can be less than or equal to the clamping force FK. The adjusting force FE can also be designated as the mounting force. With the aid of the adjusting force FE, an initial contact zone or an initial contact face 440 in the form of a point or a line can be generated between the bearing portion 412 and the optical element 300. The austenite of the shape-memory alloy is thereby elastically deformed. That is to say, there is a punctiform or linear contact between the bearing portion 412 and the optical element 300. The optical element 300 can be adjusted particularly well on account of the small size of the contact face 440.

Figure 7:
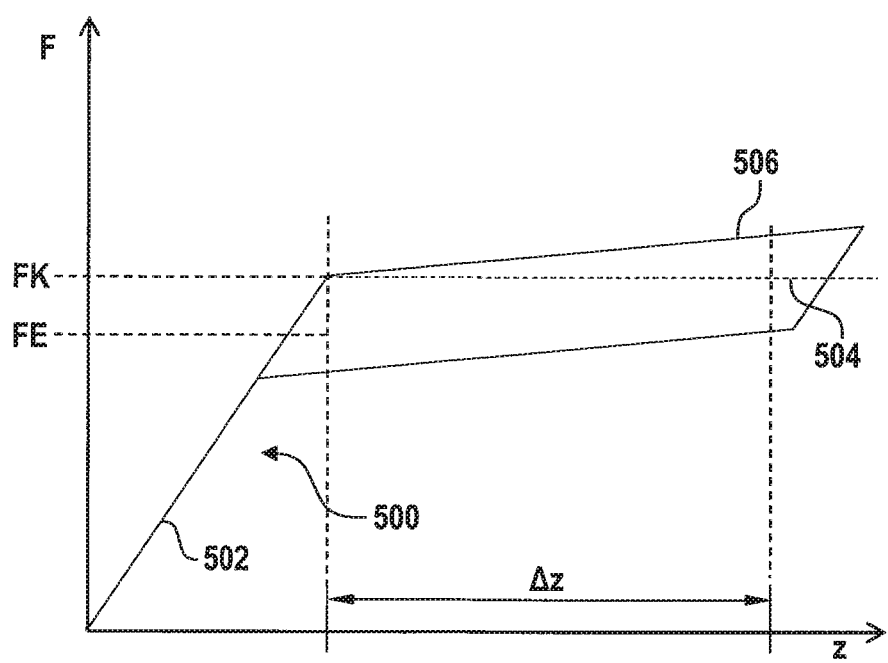
FIG. 7 shows a schematic force-distance diagram of a shape-memory alloy.

In this connection, FIG. 7 shows a schematic representation of an example of a force-distance diagram of the shape-memory alloy used. A characteristic curve 500 of the shape-memory alloy shows an initially linear force increase 502 of an acting force F upon a deformation of the shape-memory alloy, for example in the third spatial direction z. For example, the force F increases linearly as far as the attainable clamping force FK, wherein the austenite is elastically deformed. The adjusting force FE is chosen to be slightly below or equal to the clamping force FK, such that the deformation of the shape-memory alloy of the bearing portion 412 for adjusting the optical element 300 takes place only elastically, and not pseudo-elastically. In the elastic deformation of the bearing portion 412, the adjusting force FE increases until the level of the pseudo-elastic deformation is reached. Thereafter, the force increases only very slightly during the pseudo-elastic deformation along the expansion. Expansions of up to a maximum of 8% can be reached while the clamping force FK is reached and the bearing portion 412 is pseudo-elastically deformed.

If the optical element 300 is adjusted, the bearing portion 412 is further deformed, wherein the bearing portion 412 is deformed, for example in the third spatial direction z (the same can apply for the first spatial direction x and/or the second spatial direction y), by a clamping distance Δz. Only then is the clamping force FK reached. As FIG. 7 shows, the characteristic curve 500 of the shape-memory alloy has a force plateau 504 starting from the clamping force FK. That is to say, during the deformation of the bearing portion 412 by the clamping distance Δz, the clamping force FK no longer increases linearly. The shape-memory alloy is pseudo-elastically deformed, wherein the austenite transforms to martensite. This transformation is reversible. The force plateau 504 can rise gently, since the material properties of the shape-memory alloy are superposed by a geometry-induced spring stiffness of the bearing portion 412. FIG. 7 also shows the hysteresis 506 of the characteristic curve 500. The adjusting force FE and the clamping force FK can be applied with the aid of the connection element 430.

During the deformation of the bearing portion 412 by the clamping distance Δz, the clamping force FK thus changes only slightly, or not at all. An equal force behaviour is achieved in which the clamping force FK does not change or changes only slightly. However, the geometry of the bearing portion 412 changes, its deformed state being indicated in FIG. 5 by reference sign 412'. The volume of the bearing portion 412 does not change during the deformation thereof. As a result of the deformation of the bearing portion 412, however, the initial contact face 440 enlarges to give a final contact face 440'. Moreover, a radius R414 of the rounding 414 also increases. The rounding after the deformation is designated by reference sign 414'. The radius after the deformation is designated by reference sign R414'.

The pseudo-elasticity of the shape-memory alloy is temperature-dependent. The working points when the pseudo-elasticity can be utilized are dependent on the material treatment and on the alloy composition. For example, a working point can be at 22° C. and can ensure clamping in a process temperature range from 20° C. to 100° C.

The surface enlargement leads to a reduction of the surface pressure between the optical element 300 and the bearing portion 412. The enlargement of the radius R414 leads to a reduction of the Hertzian stress. This prevents undesired influencing of the properties, in particular the optical properties, of the optical element 300. Moreover, the surface enlargement also improves the heat transfer between the optical element 300 and the bearing portion 412. Therefore, by comparison with known optical systems, it is possible to achieve stress-reduced and improved clamping at a constant clamping force FK, an improved heat transfer since the contact face 440 becomes larger, and a reduced surface pressure. Moreover, a thermal expansion of both partners does not cause an increase in the induced stress, since the area of the process-induced thermal expansion, in the use of the connection, lies within the pseudo-elastic expansion range.

Figure 8:
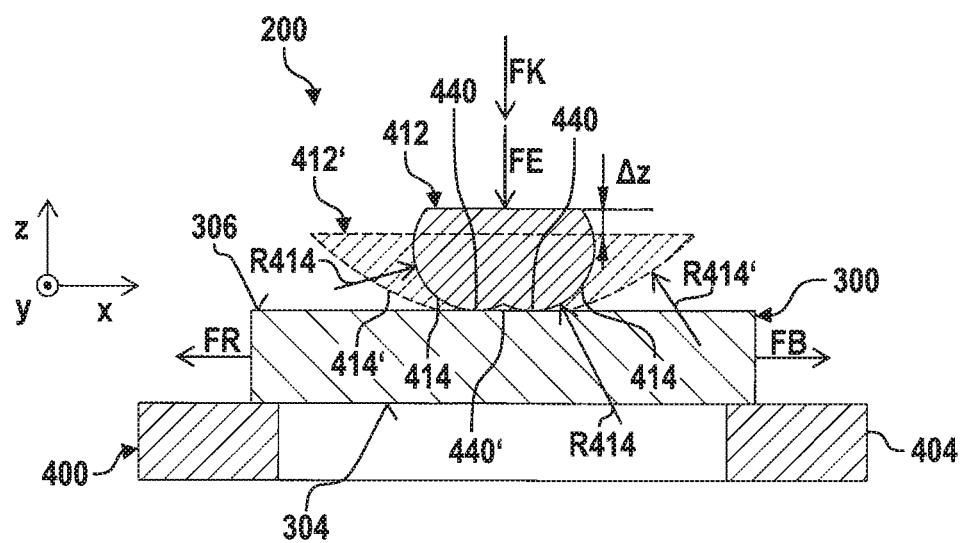
FIG. 8 shows a schematic sectional view of a further embodiment of an optical system.
Figure 9:
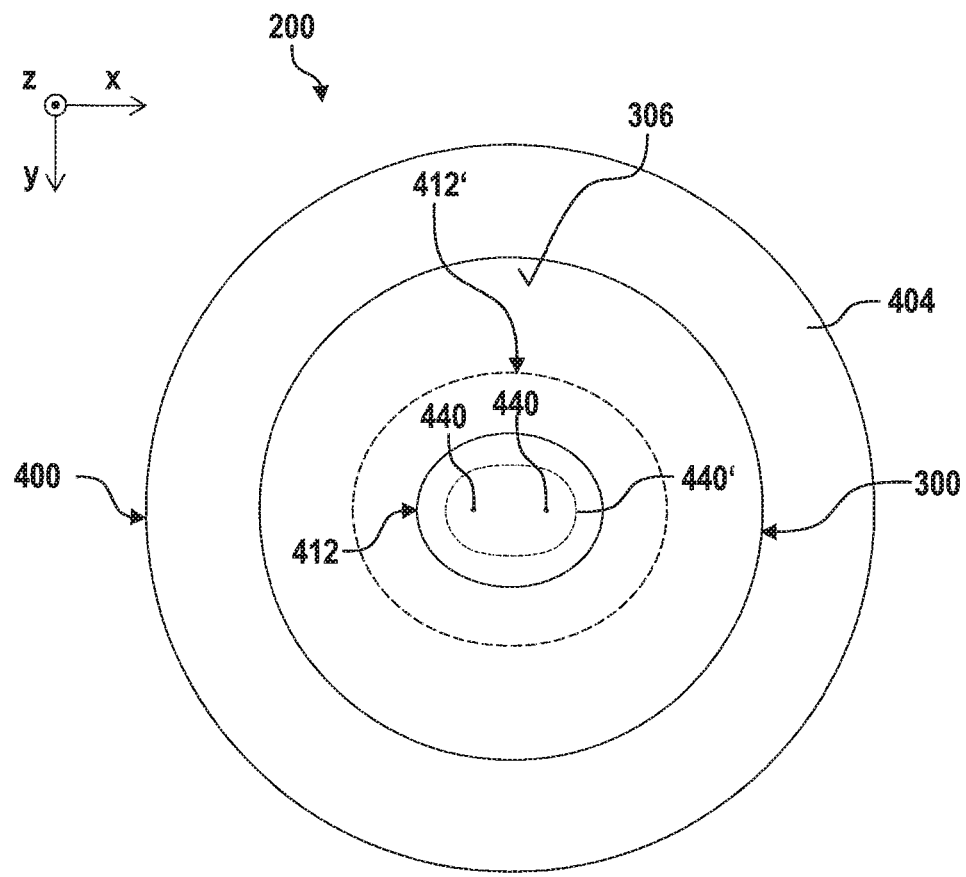
FIG. 9 shows a schematic plan view of the optical system according to FIG. 8.

FIGS. 8 and 9 show a schematic sectional view and a schematic plan view, respectively, of a development of the optical system 200 according to FIGS. 5 and 6. Only those features distinguishing the optical system 200 according to FIGS. 8 and 9 from the optical system 200 according to FIGS. 5 and 6 are discussed below.

The bearing portion 412 contacts the optical element 300 not only at one point or only at one line but instead at two points or two lines. Accordingly, upon application of the adjusting force FE, two initial contact faces 440 are provided, which are spaced apart from each other. In the deformation of the bearing portion 412 by the clamping distance Δz, the bearing portion 412 deforms pseudo-elastically in such a way that the bearing portion 412 bears with a large final contact face 440' on the optical element 300. In this way, it is possible to achieve a particularly low surface pressure or a particularly low Hertzian stress and particularly good heat transfer.

Figure 10:
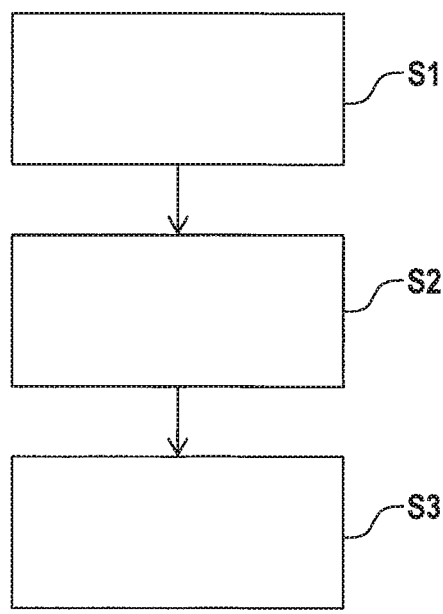
FIG. 10 shows a schematic block diagram of an embodiment of a method for producing an optical system.

FIG. 10 shows a schematic block diagram of a method for producing such an optical system 200. In a step S1, the optical element 300 is arranged between the first component 402 and the second component 404. At least one of the components 402, 404 includes the bearing portion 412, 426 contacting the optical element 300, which bearing portion has the pseudo-elastically deformable shape-memory alloy.

In a step S2, the first component 402 and/or the second component 404 are subjected to the clamping force FK in order to hold the optical element 300 with force-fit engagement between the first component 402 and the second component 404. In a step S3, the bearing portion 412, 426 is then pseudo-elastically deformed. In the step S3, the bearing portion 412, 426 is pseudo-elastically deformed in particular by the clamping distance Δz.

Although the disclosure has been described here on the basis of preferred exemplary embodiments, it is not in any way restricted to them but rather can be modified in a wide variety of ways.

LIST OF REFERENCE SIGNS

100A EUV lithography apparatus
100B DUV lithography apparatus
102 beam-shaping and illumination system
104 projection system
106A EUV light source
106B DUV light source
108A EUV radiation
108B DUV radiation
110 mirror
112 mirror
114 mirror
116 mirror
118 mirror
120 photomask
122 mirror
124 wafer
126 optical axis
128 lens
130 mirror
132 immersion liquid
200 optical system
300 optical element
302 outer contour
304 optically effective surface
306 optically effective surface
308 central axis
310 prismatic body
400 holding device
402 component
404 component
406 receiving portion
408 inner contour
410 bottom surface
412 bearing portion
412' bearing portion
414 rounding
414' rounding
416 receiving portion
418 inner contour
420 bottom surface
422 bevel
424 outer contour
426 bearing portion
428 rounding
430 connection element
432 grip portion
434 grip portion
436 base portion
438 front face
440 contact face
500 characteristic curve
502 force increase
504 force plateau
506 hysteresis
F force
FB acceleration force
FE adjusting force
FK clamping force
FR frictional force
M1 mirror
M2 mirror
M3 mirror
M4 mirror
M5 mirror
M6 mirror
R414 radius
R414' radius
S1 step
S2 step
S3 step
x spatial direction
y spatial direction
z spatial direction
Δz clamping distance

What is claimed is:

1. An optical system, comprising:
   a first component comprising a bearing portion which comprises a shape-memory alloy;
   a second component; and
   an optical element is held between the first and second components via a clamping force,
   wherein:
   the bearing portion contacts the optical element;
   when the bearing portion is in a pseudo-elastically undeformed state, the bearing portion contacts the optical element in a punctiform manner or a linear manner; and
   the optical system is a lithography optical system.

2. The optical system of claim 1, wherein, when the bearing portion is in a pseudo-elastically undeformed state, the bearing portion contacts the optical element in a punctiform manner.

3. The optical system of claim 1, wherein, when the bearing portion is in a pseudo-elastically undeformed state, the bearing portion contacts the optical element in a punctiform manner with more than one point contact.

4. The optical system of claim 1, wherein, when the bearing portion is in a pseudo-elastically undeformed state, the bearing portion contacts the optical element in a linear manner.

5. The optical system of claim 1, wherein, when the bearing portion is in a pseudo-elastically undeformed state, the bearing portion contacts the optical element in a linear manner with more than one line contact.

6. The optical system of claim 1, wherein, when the bearing portion is in a pseudo-elastically undeformed state, a contact face between the bearing portion and the optical element is smaller than a contact face between the bearing portion and the optical element when the bearing portion is in a pseudo-elastically deformed state.

7. The optical system of claim 1, wherein the first component comprises a multiplicity of bearing portions.

8. The optical system of claim 1, wherein the optical element is form-fit in the first component.

9. The optical system of claim 1, wherein the first component is ring-shaped, the second component is ring-shaped, and the second component is form-fit to the first component.

10. The optical system of claim 9, wherein the bearing portion is ring-shaped.

11. The optical system of claim 1, wherein the first component is ring-shaped, the second component is ring-shaped, and the second component is force-fit to the first component.

12. The optical system of claim 11, wherein the bearing portion is ring-shaped.

13. The optical system of claim 1, wherein the first component is plate-shaped, the second component is plate-shaped, and the second component is form-fit to the first component.

14. The optical system of claim 13, wherein the bearing portion is web-shaped.

15. The optical system of claim 1, wherein the first component is plate-shaped, the second component is plate-shaped, and the second component is force-fit to the first component.

16. The optical system of claim 15, wherein the bearing portion is web-shaped.

17. The optical system of claim 1, wherein the optical element comprises a member selected from the group consisting of a prismatic body, a mirror, and a lens.

18. An apparatus, comprising an optical system according to claim 1, wherein the apparatus is a lithography apparatus.

19. A method of making an optical system for a lithography apparatus comprising an optical element between first and second components, the first component comprising a bearing portion contacting the optical element, the bearing portion comprising a shape-memory alloy, the method comprising:
   a) subjecting at least one member selected from the group consisting of the first component and the second component to a clamping force to force-fit the optical element between the first and second components such that the bearing portion contacts the optical element in a punctiform manner or a linear manner; and
   b) after a), pseudo-elastically deforming the bearing portion.

20. The method of claim 19, further comprising between a) and b), subjecting at least one member selected from the group consisting of the first component and the second component to an adjusting force to elastically deform the bearing portion.

* * * * *

UNITED STATES PATENT AND TRADEMARK OFFICE
CERTIFICATE OF CORRECTION

PATENT NO. : 10,613,443 B2
APPLICATION NO. : 16/277102
DATED : April 7, 2020
INVENTOR(S) : Joachim Hartjes It is certified that error appears in the above-identified patent and that said Letters Patent is hereby corrected as shown below:

In the Specification

Column 11, Line 59, delete "desireed" and insert -- desired --.

Signed and Sealed this
Twenty-sixth Day of May, 2020

Andrei Iancu
*Director of the United States Patent and Trademark Office*